(12) United States Patent
Nakao et al.

(10) Patent No.: US 8,039,390 B2
(45) Date of Patent: Oct. 18, 2011

(54) METHOD OF MANUFACTURING SEMICONDUCTOR DEVICE

(75) Inventors: Yuichi Nakao, Kyoto (JP); Satoshi Kageyama, Kyoto (JP); Yoshihisa Takada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 56 days.

(21) Appl. No.: 12/535,665

(22) Filed: Aug. 4, 2009

(65) Prior Publication Data

US 2010/0035428 A1  Feb. 11, 2010

(30) Foreign Application Priority Data

Aug. 5, 2008  (JP) ................. 2008-202139
Aug. 22, 2008 (JP) ................. 2008-214627
Aug. 29, 2008 (JP) ................. 2008-221833

(51) Int. Cl.
    *H01L 21/68* (2006.01)
(52) U.S. Cl. ............... 438/653; 257/E21.584
(58) Field of Classification Search .......... 438/653; 257/E21.584
    See application file for complete search history.

(56) References Cited

U.S. PATENT DOCUMENTS

| 5,418,187 A * | 5/1995 | Miyanaga et al. ............ 438/607 |
| 6,537,904 B1 * | 3/2003 | Ishizuka ....................... 438/623 |
| 2005/0218519 A1 | 10/2005 | Koike et al. |
| 2008/0213998 A1 * | 9/2008 | Nagai et al. .................. 438/653 |

FOREIGN PATENT DOCUMENTS

JP   2005-277390 A   10/2005

* cited by examiner

*Primary Examiner* — A. Sefer
*Assistant Examiner* — Monica D Harrison
(74) *Attorney, Agent, or Firm* — Rabin & Berdo, PC

(57) ABSTRACT

The method of manufacturing a semiconductor device according to the present invention includes: a groove forming step of forming a groove in an insulating layer made of an insulating material containing Si and O; an alloy film applying step of covering the side surface and the bottom surface of the groove with an alloy film made of an alloy material containing Cu and Mn by sputtering; a thinning step of reducing the thickness of a portion of the alloy film covering the bottom surface of the groove; a wire forming step of forming a Cu wire made of a metallic material mainly composed of Cu in the groove after the thinning step; and a barrier film forming step of forming a barrier film made of MnSiO between the Cu wire and the insulating layer by heat treatment.

13 Claims, 12 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device having a Cu wire made of a metallic material mainly composed of Cu (copper).

2. Description of Related Art

In a highly integrated semiconductor device, Cu having higher conductivity than Al (aluminum) may be employed as the material for a wire. A wire made of Cu is embedded in a fine groove formed in an insulating film (an interlayer dielectric film) on a semiconductor substrate by a damascene process, since it is difficult to finely pattern Cu by dry etching.

In general, $SiO_2$ is employed as the material for the insulating film. However, Cu has high diffusibility into $SiO_2$. When the inner surface of the groove formed in the insulating film made of $SiO_2$ and the wire made of Cu are directly in contact with each other, Cu diffuses into the insulating film. This diffusion tends to reduce the dielectric voltage of the insulating film. Therefore, a barrier film for preventing Cu from diffusing into the insulating film must be provided between the insulating film and the wire made of Cu.

A self-formation process employing a CuMn alloy is known as a technique of forming the barrier film. In the self-formation process, an alloy film made of an alloy of Cu and Mn (manganese) is formed on the surface of the insulating film including the inner surface of the groove by sputtering, in advance of formation of the wire. Then, a plating layer made of Cu is formed on the alloy film by plating. Thereafter heat treatment is performed, whereby Mn in the alloy film is bonded to Si (silicon) and O (oxygen) in the insulating film, and a barrier film made of $Mn_xSi_yO_z$ (x, y and z: numbers greater than zero. $Mn_xSi_yO_z$ is hereinafter simply referred to as "MnSiO") is formed between the plating layer and the insulating film, i.e., on the inner surface of the groove.

Excess Mn not contributing to the formation of the barrier film diffuses into the plating layer made of Cu. If the quantity of Mn diffusing into the plating layer is large, Mn remains in the Cu wire formed by planarizing the plating layer, to increase the resistance of the wire. Therefore, the alloy film made of the CuMn alloy is preferably formed with a thickness necessary and sufficient for forming the barrier film.

When the alloy film is formed by sputtering, however, the CuMn alloy is harder to bond to the side surfaces of the groove as compared with the bottom surface thereof. If the alloy film is formed with a small thickness as a whole to have the thickness necessary and sufficient for forming the barrier film on the bottom surface of the groove, therefore, portions of the alloy film formed on the side surfaces of the groove are excessively reduced in thickness. Consequently, adhesiveness between the alloy film and the side surfaces of the groove may be reduced, to result in separation of the alloy film from the side surfaces of the groove. When the alloy film separates from the side surfaces of the groove, the barrier film made of MnSiO cannot be excellently formed on the separating portions.

If the alloy film is formed with a thickness not causing separation of the alloy film on the side surfaces of the groove, on the other hand, the thickness of a portion of the alloy film formed on the bottom surface of the groove is increased more than necessary. Consequently, the quantity of Mn contained in the alloy film is excessively increased, to disadvantageously cause an increase in wiring resistance resulting from the increased quantity of Mn remaining in the Cu wire.

SUMMARY OF THE INVENTION

An object of the present invention is to provide a method of manufacturing a semiconductor device capable of reducing the quantity of Mn remaining in a Cu wire while preventing separation of an alloy film from the side surface of a groove.

A method of manufacturing a semiconductor device according to a first aspect of the present invention includes: a groove forming step of forming a groove in an insulating layer made of an insulating material containing Si and O; an alloy film applying step of covering the side surface and the bottom surface of the groove with an alloy film made of an alloy material containing Cu and Mn by sputtering; a thinning step of reducing the thickness of a portion of the alloy film covering the bottom surface of the groove; a wire forming step of forming a Cu wire made of a metallic material mainly composed of Cu in the groove after the thinning step; and a barrier film forming step of forming a barrier film made of MnSiO between the Cu wire and the insulating layer by heat treatment.

According to the method, the groove is first formed in the insulating film made of the insulating material containing Si and O. Then, the side surface and the bottom surface of the groove are covered with the alloy film made of the alloy material containing Cu and Mn by sputtering. Then, the thickness of the portion of the alloy film covering the bottom surface of the groove is reduced. Thereafter the Cu wire made of the metallic material mainly composed of Cu is formed on the alloy film. After the formation of the Cu wire, the barrier film made of MnSiO is formed between the Cu wire and the insulating layer by heat treatment.

The alloy film is formed to have a thickness not causing separation on the side surface of the groove, whereby separation of the alloy film from the side surface of the groove can be prevented. Further, the thickness of the portion of the alloy film covering the bottom surface of the groove is reduced while the thickness of the alloy film on the side surface of the groove is ensured, whereby the quantity of excess Mn not contributing to the formation of the barrier film can be reduced. Consequently, the quantity of Mn remaining in the Cu wire can be reduced. Therefore, the quantity of Mn remaining in the Cu wire can be reduced while preventing separation of the alloy film from the side surface of the groove.

Preferably, reverse sputtering is employed in the thinning step. Preferably, the wire forming step includes the steps of forming a seed film made of a metallic material mainly composed of Cu on the alloy film by sputtering after the thinning step and forming a plating layer made of Cu on the seed film by plating.

The reverse sputtering can be performed in a sputtering apparatus identical to that employed for the sputtering. When the reverse sputtering is employed in the thinning step, therefore, the alloy film applying step and the thinning step can be continuously carried out in the same sputtering apparatus. When the seed film is formed on the alloy film by sputtering, further, the step of forming the seed film can be continuously carried out in the same sputtering apparatus, in addition to the alloy film applying step and the thinning step. Therefore, the structure of semiconductor equipment can be simplified, and a semiconductor wafer (a semiconductor substrate in a wafer state provided with the insulating layer) may not be transported between the steps, whereby the time necessary for manufacturing the semiconductor device can be reduced.

A method of manufacturing a semiconductor device according to a second aspect of the present invention includes: a groove forming step of forming a groove in an insulating layer made of an insulating material containing Si and O; an alloy film applying step of covering the inner surface of the groove with an alloy film made of an alloy material containing Cu and Mn by sputtering so that a portion in contact with the inner surface of the groove has a relatively high Mn concentration and a surface layer portion has a relatively low Mn concentration; a Cu layer forming step of forming a Cu layer made of a metallic material mainly composed of Cu on the alloy film to fill up the groove; and a barrier film forming step of forming a barrier film made of MnSiO between the Cu layer and the insulating layer by heat treatment.

According to the method, the groove is first formed in the insulating layer made of the insulating material containing Si and O. Then, the inner surface of the groove (the side surface and the bottom surface of the groove when the groove is concavely formed) is covered with the alloy film made of the alloy material containing Cu and Mn by sputtering. The alloy film is so formed that the portion in contact with the inner surface of the groove has a relatively high Mn concentration and the surface layer portion has a relatively low Mn concentration. Then, the Cu layer made of the metallic material mainly composed of Cu is formed on the alloy film, to fill up the groove. After the formation of the Cu layer, the barrier film made of MnSiO is formed between the Cu layer and the insulating layer by heat treatment.

Adhesiveness of the alloy material (a CuMn alloy) containing Cu and Mn to the insulating material containing Si and O is increased as the Mn concentration is increased. When the portion of the alloy film in contact with the inner surface of the groove has a high Mn concentration, therefore, the alloy film has high adhesiveness to the side surface of the groove regardless of the thickness on the side surface of the groove. Therefore, separation of the alloy film from the side surface of the groove can be prevented. The surface layer portion of the alloy film has a low Mn concentration while the portion of the alloy film in contact with the inner surface of the groove has a high Mn concentration, whereby the quantity of Mn contained in the overall alloy film remains identical or is reduced as compared with a case of forming a film made of a CuMn alloy having a uniform Mn concentration with the same thickness as the alloy film. Therefore, increase in the quantity of excess Mn not contributing to the formation of the barrier film can be prevented, and increase in the quantity of Mn remaining in the Cu layer can be prevented. Thus, separation of the alloy film from the side surface of the groove can be prevented without increasing the quantity of Mn remaining in the Cu layer.

The Cu layer forming step may include the steps of forming a seed film made of a metallic material mainly composed of Cu on the alloy film by sputtering and forming a plating layer made of Cu on the seed film by plating.

The alloy film can be formed by dual sputtering employing a Cu target and an Mn target, for example. More specifically, a film made of Cu and Mn can be formed by colliding an ionized rare gas element (argon gas, for example) with the Cu target and the Mn target at the same time. At this time, the concentration of Mn contained in the alloy film can be continuously changed to be reduced toward the surface side by varying the collisional energy of the rare gas element with the Cu target and the Mn target.

The alloy film may be formed by sputtering employing a plurality of CuMn alloy targets having different Mn concentrations. More specifically, a plurality of films made of CuMn alloys having different Mn concentrations can be successively formed by successively employing the CuMn alloy targets from that having the highest Mn concentration for the sputtering and colliding an ionized rare gas element with each CuMn alloy target. When the alloy film is formed by this method, the concentration of Mn contained in the alloy film changes stepwise to be reduced toward the surface side.

A method of manufacturing a semiconductor device according to a third aspect of the present invention includes: a groove forming step of forming a groove in an insulating layer made of an insulating material containing Si and O; an alloy film applying step of covering the inner surface of the groove with an alloy film made of an alloy material containing Cu and Mn by bias sputtering; a Cu layer forming step of forming a Cu layer made of a metallic material mainly composed of Cu on the alloy film to fill up the groove; and a barrier film forming step of forming a barrier film made of MnSiO between the Cu layer and the insulating layer by heat treatment. An RF (Radio Frequency) bias is so set in the alloy film applying step that sputtered particles adhering to the bottom surface of the groove are flicked to adhere to the side surface of the groove by the energy of sputtered particles scattering toward the inner surface of the groove.

According to the method, the groove is first formed in the insulating layer made of the insulating material containing Si and O. Then, the inner surface (the side surface and the bottom surface) of the groove is covered with the alloy film made of the alloy material containing Cu and Mn. Thereafter the Cu layer made of the metallic material mainly composed of Cu is formed on the alloy film, to fill up the groove. After the formation of the Cu layer, the barrier film made of MnSiO is formed between the Cu layer and the insulating layer by heat treatment.

The alloy film is formed by bias sputtering. In the formation (the alloy film applying step) of the alloy film by bias sputtering, the RF bias for accelerating the sputtered particles is so set that the sputtered particles adhering to the bottom surface of the groove are flicked to re-adhere (re-sputter) to the side surface of the groove by the energy of the sputtered particles scattering toward the inner surface of the groove. Thus, adhesiveness of the alloy film to the side surface of the groove (side coverage) can be improved as compared with a case of forming the alloy film by non-bias sputtering (sputtering applying no RF bias).

Consequently, the thickness of a portion of the alloy film formed on the side surface of the groove can be approximated to the thickness of a portion formed on the bottom surface of the groove, and the alloy film having a generally uniform thickness can be formed on the overall region of the inner surface of the groove. When the alloy film is set to the minimum thickness necessary for forming the barrier film, therefore, the quantity of excess Mn not contributing to the formation of the barrier film can be reduced while preventing separation of the alloy film from the side surface of the groove.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
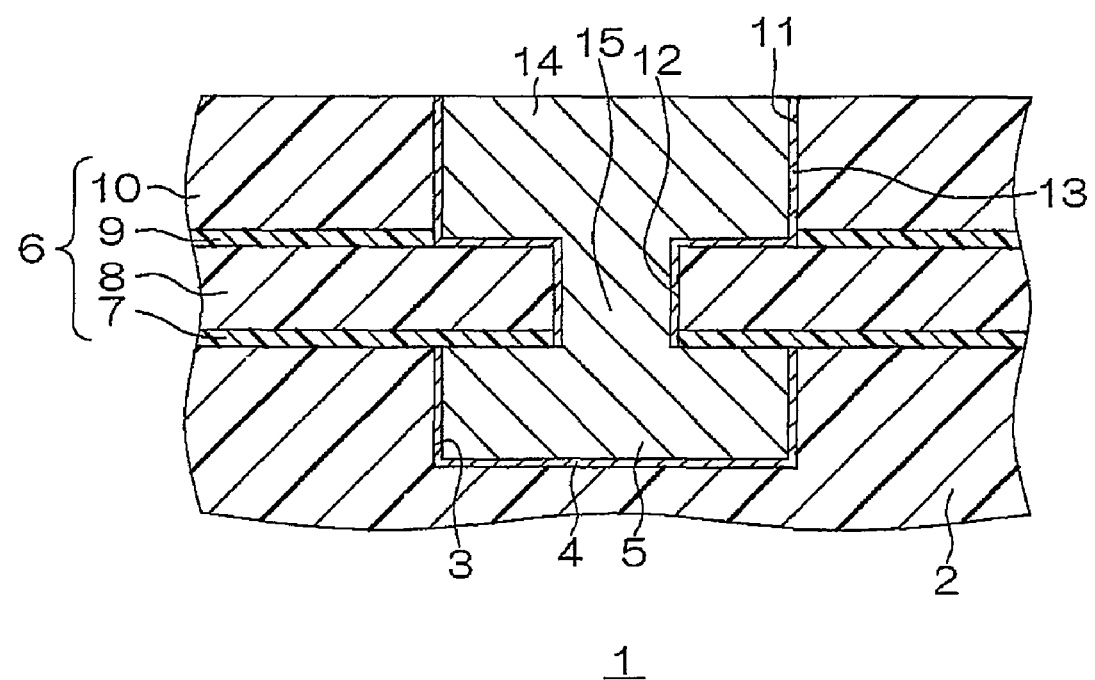
FIG. 1 is a schematic sectional view showing the structure of a semiconductor device according to the present invention.

FIG. 1 is a schematic sectional view showing the structure of a semiconductor device according to the present invention.

A semiconductor device 1 has a multilayer interconnection structure employing Cu as a wire material on a semiconductor substrate (not shown).

The semiconductor substrate is formed by an Si (silicon) substrate, for example. Functional elements such as MOSFETs (Metal Oxide semiconductor Field-Effect Transistors) are provided on a surface layer portion of the semiconductor substrate.

A first insulating layer 2 made of $SiO_2$ (silicon oxide) is laminated on the semiconductor substrate.

A first groove 3 is formed in a surface layer portion of the first insulating layer 2 in a prescribed pattern. The first groove 3 is in the form of a recess dug from the upper surface of the first insulating layer 2. A first barrier film 4 made of MnSiO is formed on the inner surfaces (the side surfaces and the bottom surface) of the first groove 3. A first wire 5 made of a metallic material mainly composed of Cu is embedded in the first groove 3 through the first barrier film 4.

A second insulating layer 6 is stacked on the first insulating layer 2. The second insulating layer 6 has a structure obtained by stacking a diffusion preventing film 7, a first interlayer dielectric film 8, an etching stopper film 9 and a second interlayer dielectric film 10 in this order from the side of the first insulating layer 2.

The diffusion preventing film 7 has a structure obtained by stacking SiC (silicon carbide) and SiCN (silicon carbonitride), for example.

The first interlayer dielectric film 8 and the second interlayer dielectric film 10 are made of $SiO_2$, for example.

The etching stopper film 9 is made of SiC, for example.

A second groove 11 is formed in a surface layer portion of the second insulating layer 6. The second groove 11 is in the form of a recess dug from the upper surface of the second interlayer dielectric film 10 up to the upper surface of the first interlayer dielectric film 8. The side surfaces of the second groove 11 are formed by the second interlayer dielectric film 10 and the etching stopper film 9, while the bottom surface of the second groove 11 is formed by the upper surface of the first interlayer dielectric film 8.

The second groove 11 is formed in a pattern having a portion intersecting with the first wire 5 (the first groove 3) in plan view. In the portion where the first wire 5 and the second groove 11 intersect with each other in plan view, a via hole 12 passing through the diffusion preventing film 7 and the first interlayer dielectric film 8 is formed between the first wire 5 and the second groove 11.

A second barrier film 13 made of MnSiO is formed on the inner surfaces of the second groove 11 and the via hole 12. A second wire 14 and a via 15 made of a metallic material mainly composed of Cu are embedded in the second groove 11 and the via hole 12 respectively through the second barrier film 13. The second wire 14 and the via 15 are integrated with each other.

FIGS. 2A to 2G are schematic sectional views showing the steps of manufacturing the semiconductor device by a method according to a first embodiment of the present invention.

Figure 2A:
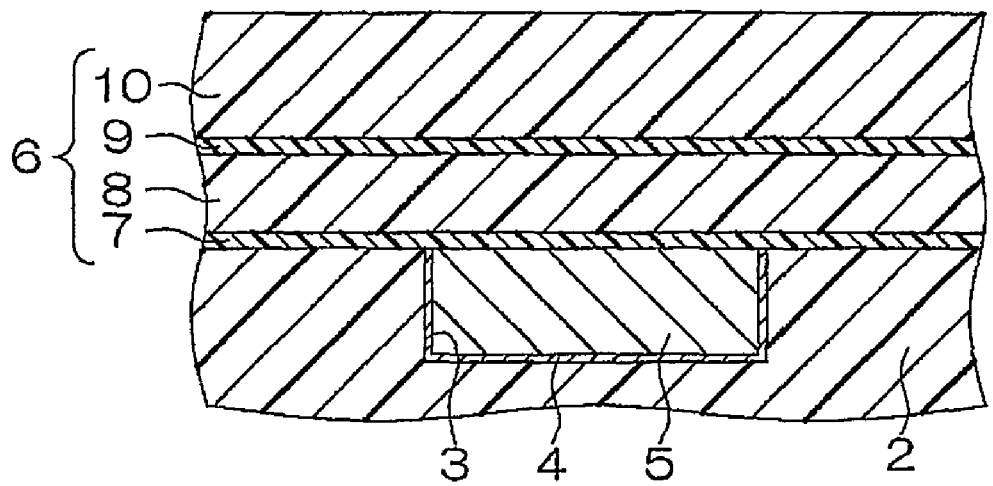
FIGS. 2A to 2G are schematic sectional views showing the steps of manufacturing a semiconductor device by a method according to a first embodiment of the present invention.

As shown in FIG. 2A, the diffusion preventing film 7, the first interlayer dielectric film 8, the etching stopper film 9 and the second interlayer dielectric film 10 are stacked in this order by CVD (Chemical Vapor Deposition) on the first insulating layer 2 having the first barrier film 4 and the first wire 5 embedded therein. Thus, the second insulating layer 6 is formed on the first insulating layer 2.

Figure 2B:
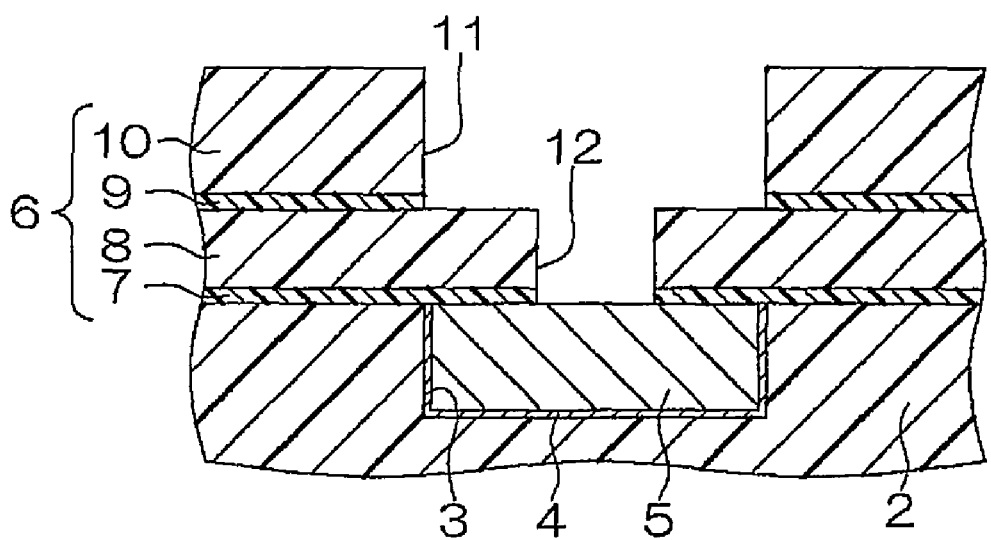

Thereafter the second groove 11 and the via hole 12 are formed in the second insulating layer 6, as shown in FIG. 2B. More specifically, a mask (not shown) having an opening selectively exposing a portion to be provided with the via hole 12 is first formed on the second insulating layer 6. Then, the second interlayer dielectric film 10, the etching stopper film 9 and the first interlayer dielectric film 8 are dry-etched through the mask. At this time, the second interlayer dielectric film 10, the etching stopper film 9 and the first interlayer dielectric film 8 are continuously etched by switching reaction gas (etchant) at proper timing. Then, the mask is removed from the second insulating layer 6, and another mask (not shown) having an opening selectively exposing a portion to be provided with the second groove 11 is formed on the second insulating layer 6. Then, the second interlayer dielectric film 10 is dry-etched through the mask. Thereafter the second groove 11 and the via hole 12 are formed by removing exposed portions of the diffusion preventing film 7 and the etching stopper film 9.

Figure 2C:
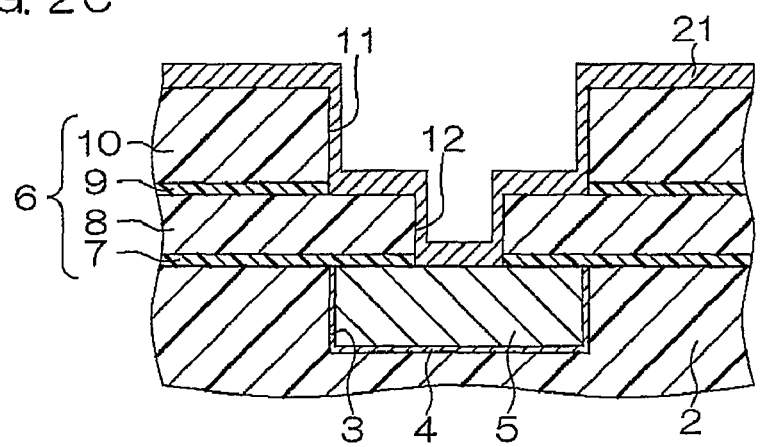

Then, the overall surface of the second insulating layer 6 including the inner surfaces of the second groove 11 and the via hole 12 and a portion of the first wire 5 exposed through the via hole 12 are covered with an alloy film 21 made of a CuMn alloy by sputtering, as shown in FIG. 2C. The alloy film 21 is formed to have a thickness not causing separation of the alloy film 21 on the side surfaces of the second groove 11 and the via hole 12, in consideration of the difficulty in bonding the CuMn alloy to the side surfaces of the second groove 11 and the via hole 12. Thus, the alloy film 21 has a sufficient thickness not causing separation on the side surfaces of the second groove 11 and the via hole 12, and has a larger thickness on the first wire 5, the bottom surface of the second groove 11 and the second interlayer dielectric film 10.

Figure 2D:
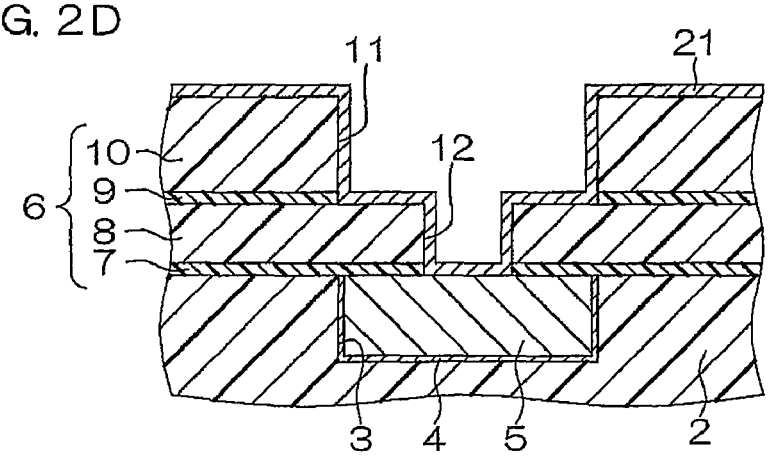

Thereafter the thickness of the portions of the alloy film 21 formed on the first wire 5, the bottom surface of the second groove 11 and the second interlayer dielectric film 10 is reduced by reverse sputtering, as shown in FIG. 2D. More specifically, gas particles (argon gas particles, for example) are collided with the alloy film 21 from a generally vertical direction (a direction along the stacking direction of the second insulating layer 6), thereby uniformly reducing the thickness of the portions formed on the first wire 5, the bottom surface of the second groove 11 and the second interlayer dielectric film 10.

Figure 2E:
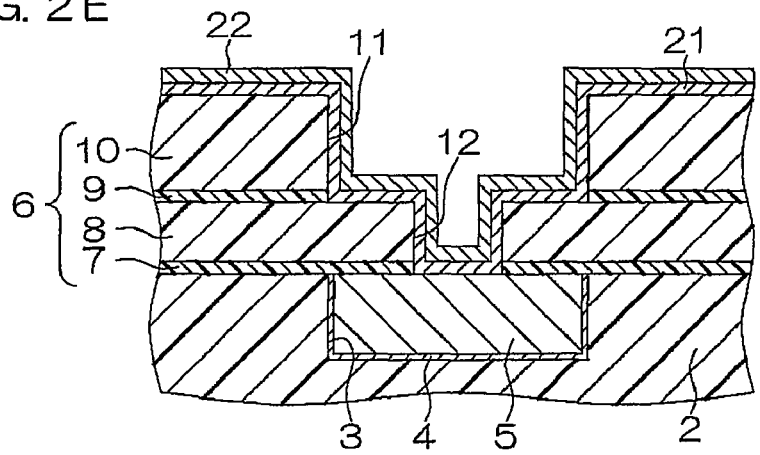

Thereafter a seed film 22 made of a metallic material mainly composed of Cu is formed by sputtering to cover the overall surface of the alloy film 21, as shown in FIG. 2E.

Figure 2F:
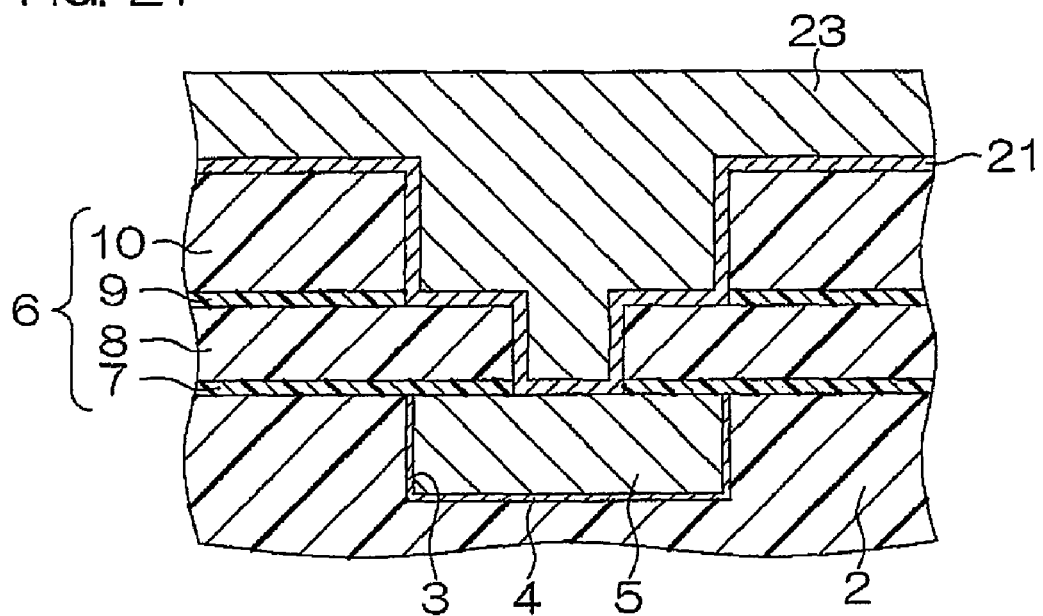

Then, a plating layer 23 made of Cu is formed on the seed film 22 by plating, as shown in FIG. 2F. The plating layer 23 is formed with a thickness for filling up the via hole 12 and the second groove 11.

Figure 2G:
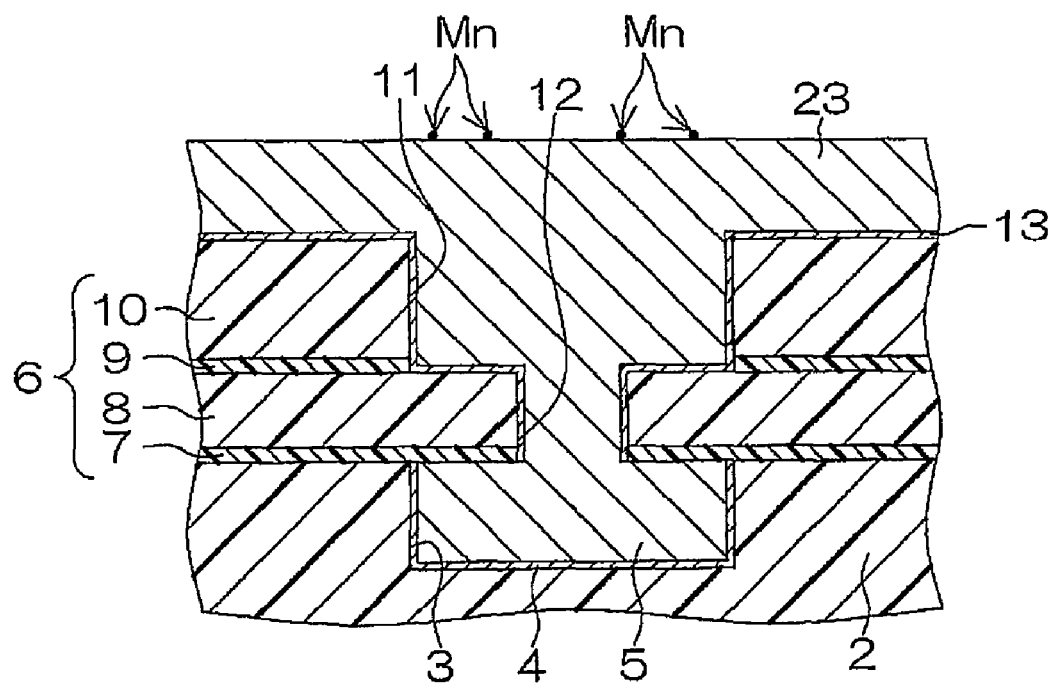

Thereafter Mn in the alloy film 21 is bonded to Si and O in the second insulating layer 6 by heat treatment. Consequently, the second barrier film 13 made of MnSiO is formed on the inner surfaces of the second groove 11 and the via hole 12, as shown in FIG. 2G. At this time, Mn in the alloy film 21 partially moves in the plating layer 23, and is deposited on the surface of the plating layer 23. The alloy film 21 is generally integrated with the plating layer 23, following the formation of the second barrier film 13.

Then, the plating layer 20 and the second barrier film 13 are polished by CMP (Chemical Mechanical Polishing). The polishing is continued until unnecessary portions of the plating layer 23 and the second barrier film 13 formed outside the second groove 11 are entirely removed, the second insulating layer 6 (the second interlayer dielectric film 10) is exposed, and the exposed surface of the second insulating layer 6 and the surface of the plating layer 23 in the second groove 11 are flush with each other. Thus, the semiconductor device 1 shown in FIG. 1 is obtained.

As herein above described, the alloy film 21 is formed to have the thickness not causing separation of the alloy film 21 on the side surfaces of the second groove 11 and the via hole 12, whereby separation of the alloy film 21 from the side surfaces of the second groove 11 can be prevented. The thickness of the portions of the alloy film 21 formed on the first wire 5, the bottom surface of the second groove 11 and the second interlayer dielectric film 10 is reduced while ensuring the thickness of the alloy film 21 on the side surfaces of the second groove 11, whereby the quantity of excess Mn not contributing to the formation of the second barrier film 13 can be reduced. Consequently, the quantity of Mn remaining in the second wire 14 can be reduced. Therefore, the quantity of Mn remaining in the second wire 14 can be reduced while separation of the alloy film 21 from the side surfaces of the second groove 11 can be prevented.

Sputtering and reverse sputtering can be performed in the same sputtering apparatus. When the reverse sputtering is employed for reducing the thickness of the portions of the alloy film 21 formed on the first wire 5, the bottom surface of the second groove 11 and the second interlayer dielectric film 10, therefore, the step of partially reducing the thickness of the alloy film 21 can be carried out continuously to the step of forming the alloy film 21 in the same sputtering apparatus. Further, the step of forming the seed film 22 can be carried out continuously to the thinning step. Therefore, the structure of semiconductor equipment can be simplified, and a semiconductor wafer (a semiconductor substrate in a wafer state provided with the insulating layers 2 and 6) may not be transported between the steps, whereby the time necessary for manufacturing the semiconductor device 1 can be reduced.

FIGS. 3A to 3F are schematic sectional views showing the steps of manufacturing the semiconductor device by a method according to a second embodiment of the present invention.

Figure 3A:
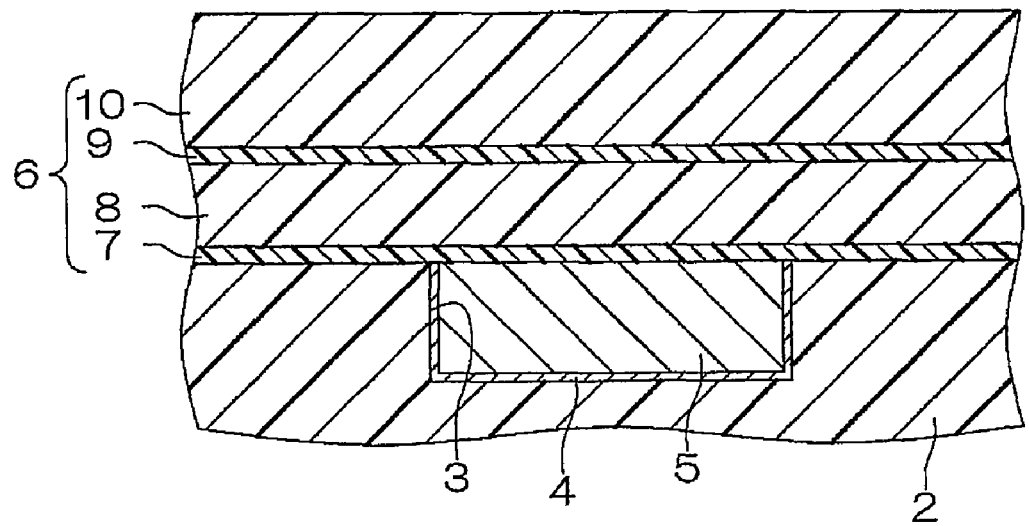
FIGS. 3A to 3F are schematic sectional views showing the steps of manufacturing a semiconductor device by a method according to a second embodiment of the present invention.

As shown in FIG. 3A, the diffusion preventing film 7, the first interlayer dielectric film 8, the etching stopper film 9 and the second interlayer dielectric film 10 are stacked in this order by CVD on the first insulating layer 2 having the first barrier film 4 and the first wire 5 embedded therein. Thus, the second insulating layer 6 is formed on the first insulating layer 2.

Figure 3B:
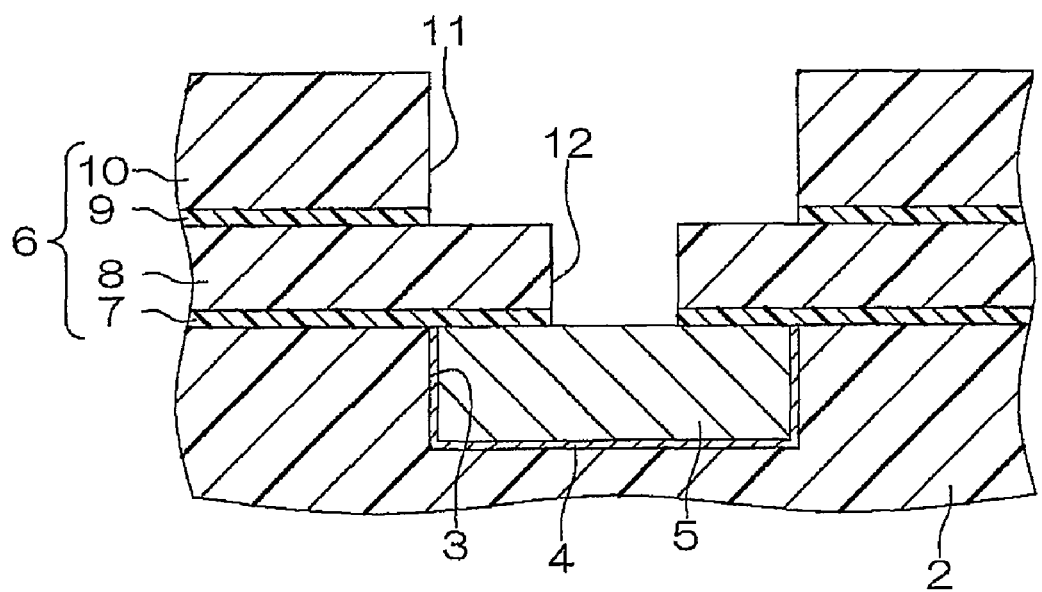

Thereafter the second groove 11 and the via hole 12 are formed in the second insulating layer 6, as shown in FIG. 3B. More specifically, a mask (not shown) having an opening selectively exposing a portion to be provided with the via hole 12 is first formed on the second insulating layer 6. Then, the second interlayer dielectric film 10, the etching stopper film 9 and the first interlayer dielectric film 8 are dry-etched through the mask. At this time, the second interlayer dielectric film 10, the etching stopper film 9 and the first interlayer dielectric film 8 are continuously etched by switching reaction gas (etchant) at proper timing. Then, the mask is removed from the second insulating layer 6, and another mask (not shown) having an opening selectively exposing a portion to be provided with the second groove 11 is formed on the second insulating layer 6. Then, the second interlayer dielectric film 10 is dry-etched through the mask. Thereafter the second groove 11 and the via hole 12 are formed by removing exposed portions of the diffusion preventing film 7 and the etching stopper film 9.

Figure 3C:
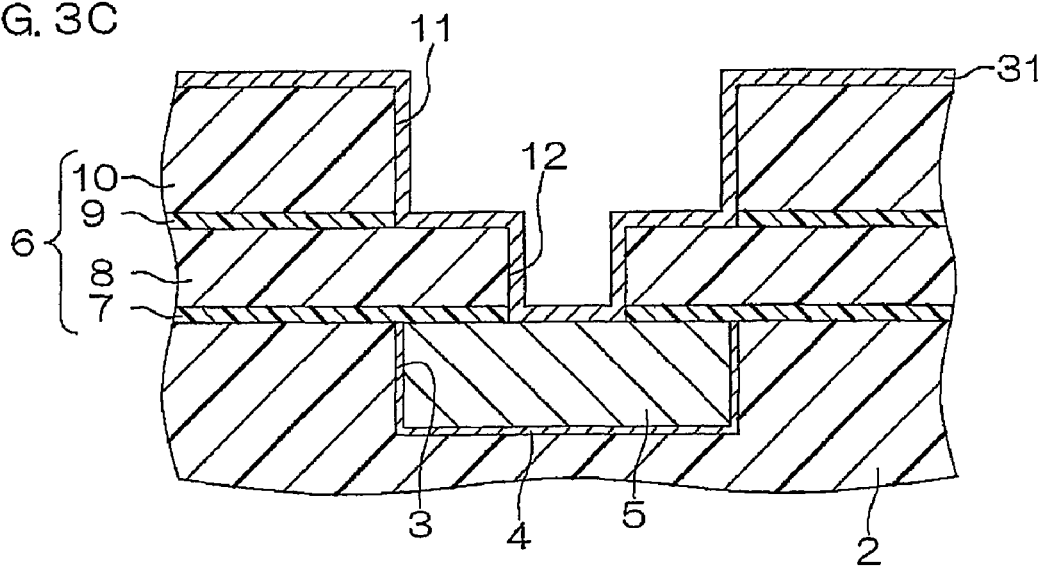

Then, the overall surface of the second insulating layer 6 including the inner surfaces of the second groove 11 and the via hole 12 and a portion of the first wire 5 exposed through the via hole 12 are covered with an alloy film 31 made of an alloy material containing Cu and Mn by dual sputtering employing a Cu target and an Mn target, as shown in FIG. 3C.

More specifically, an ionized rare gas element (argon gas, for example) is collided with the Cu target and the Mn target at the same time, thereby forming a film made of Cu and Mn on the overall surface of the second insulating layer 6 including the inner surfaces of the second groove 11 and the via hole 12 and the portion of the first wire 5 exposed through the via hole 12. At this time, the collisional energy of the rare gas element with respect to the Cu target is increased and that of the rare gas element with respect to the Mn target is reduced as the film formation progresses.

Figure 4:
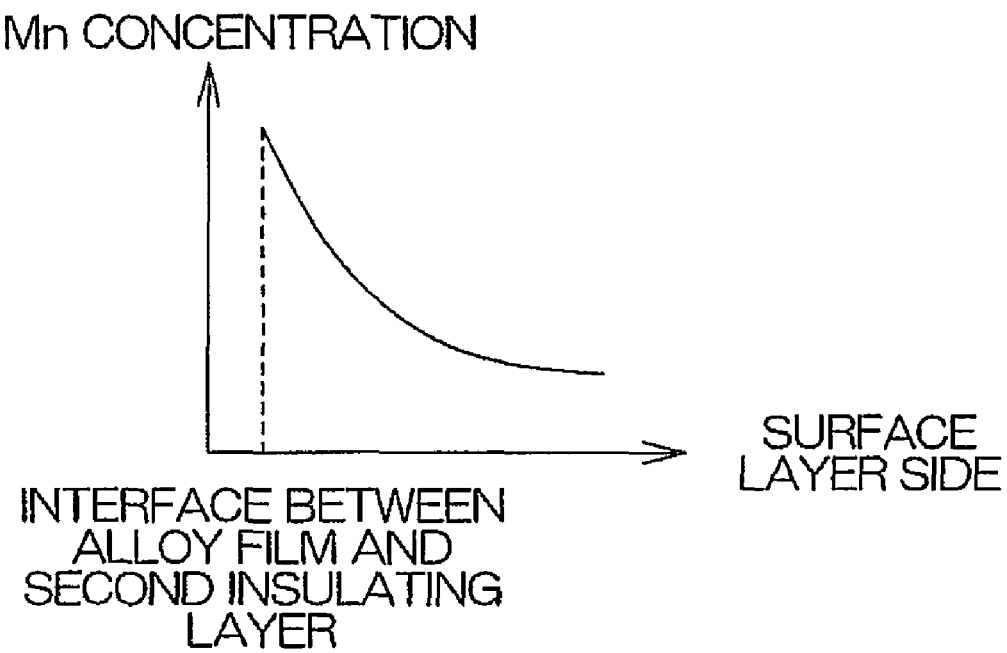
FIG. 4 is a graph showing an Mn concentration profile of an alloy film formed in the step shown in FIG. 3C.

Thus, the alloy film 31 is formed with an Mn concentration profile shown in FIG. 4. In other words, the Mn concentration in the alloy film 31 is maximized (10 at. %, for example) on the portion in contact with the second insulating layer 6 (the inner surface of the second groove 11 and the side surfaces of the via hole 12), reduced toward a surface layer portion (toward the surface), and minimized (1 at. %, for example) on the outermost surface layer portion.

Figure 3D:
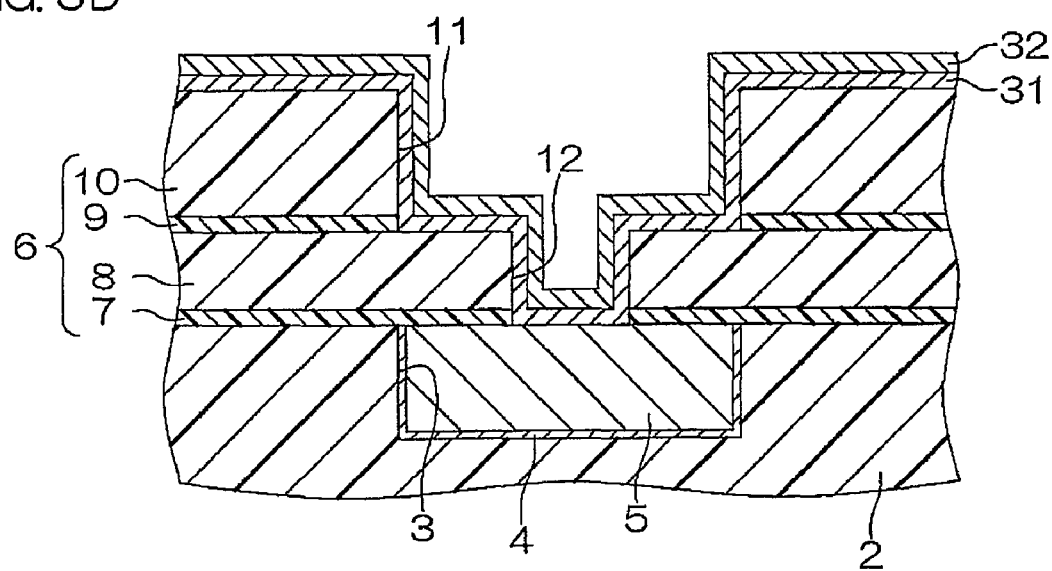

Thereafter a seed film 32 made of a metallic material mainly composed of Cu is formed by sputtering to cover the overall surface of the alloy film 31, as shown in FIG. 3D.

Figure 3E:
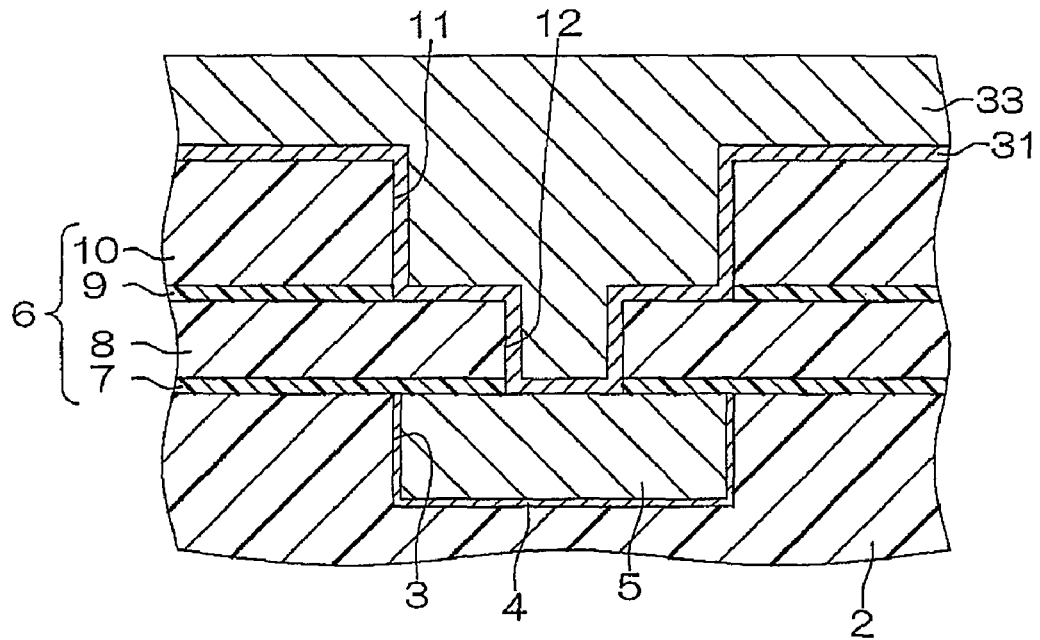

Then, a plating layer 33 made of Cu is formed on the seed film 32 by plating, as shown in FIG. 3E. The plating layer 33 is formed with a thickness for filling up the via hole 12 and the second groove 11.

Figure 3F:
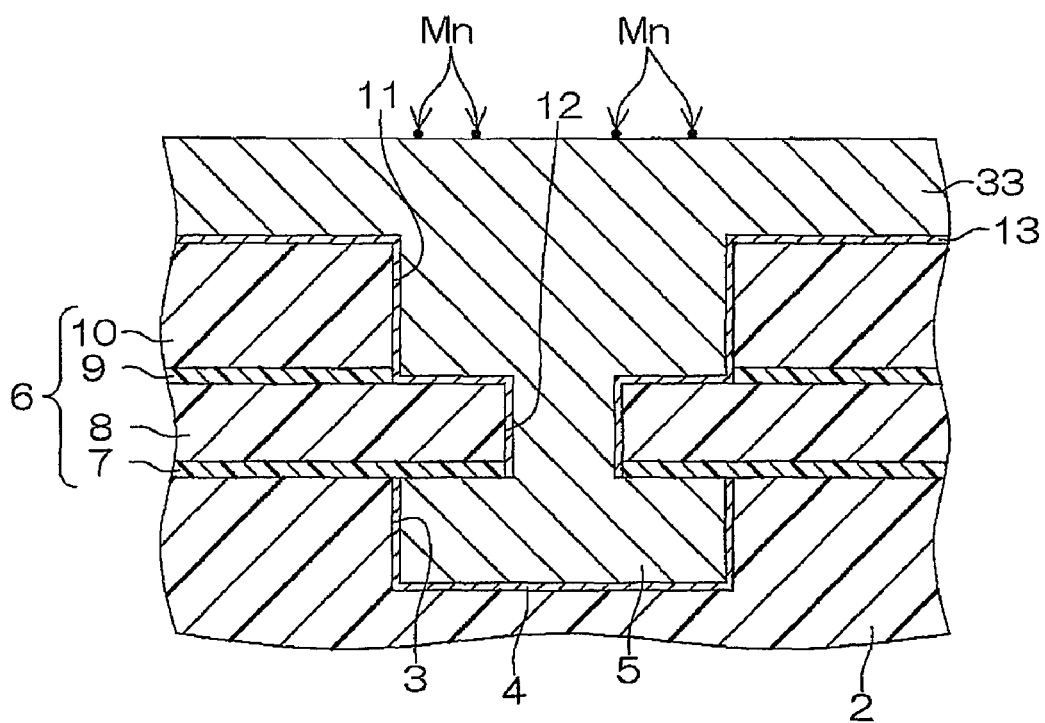

Thereafter Mn in the alloy film 31 is bonded to Si and O in the second insulating layer 6 by heat treatment. Consequently, the second barrier film 13 made of MnSiO is formed on the inner surfaces of the second groove 11 and the via hole 12, as shown in FIG. 3F. At this time, Mn in the alloy film 31 partially moves in the plating layer 33, and is deposited on the surface of the plating layer 33. The alloy film 31 disappears following the formation of the second barrier film 13.

Then, the plating layer 20 and the second barrier film 13 are polished by CMP. The polishing is continued until unnecessary portions of the plating layer 33 and the second barrier film 13 formed outside the second groove 11 are entirely removed, the second insulating layer 6 (the second interlayer dielectric film 10) is exposed, and the exposed surface of the second insulating layer 6 and the surface of the plating layer 33 in the second groove 11 are flush with each other. Thus, the second wire 14 is formed, and the semiconductor device 1 shown in FIG. 1 is obtained.

Adhesiveness of an alloy material containing Cu and Mn with respect to an insulating material containing Si and O is increased as the Mn concentration therein is increased. Therefore, the alloy film 31 having a high Mn concentration in the portion in contact with the inner surface of the second groove 11 has high adhesiveness with respect to the side surfaces of the second groove 11, despite the small thickness on the side surfaces of the second groove 11. Therefore, separation of the alloy film 31 from the side surfaces of the second groove 11 can be prevented. The alloy film 31 has a low Mn concentration in the surface layer portion while having a high Mn concentration in the portion in contact with the inner surface of the second groove 11, the quantity of Mn contained in the overall alloy film 31 remains identical or is reduced as compared with a case of forming a film made of an alloy containing Cu and Mn and having a uniform Mn concentration with the same thickness as the alloy film 31. Therefore, increase in the quantity of excess Mn not contributing to the formation of the second barrier film 13 can be prevented, and increase in the quantities of Mn remaining in the seed film 32 and the plating layer 33 can be prevented. Thus, separation of the alloy film 31 from the side surfaces of the second groove 11 can be prevented without increasing the quantities of Mn remaining in the seed film 32 and the plating layer 33 (the second wire 14).

Figure 5:
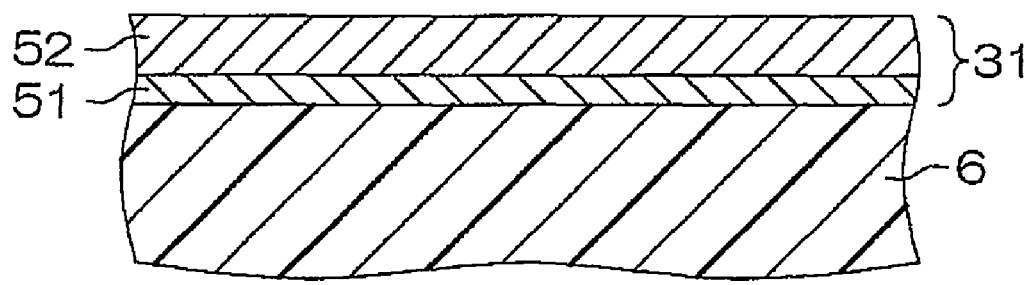
FIG. 5 is a schematic sectional view showing the structure of an alloy film formed by sputtering employing a plurality of CuMn alloy targets having different Mn concentrations.

FIG. 5 is a schematic sectional view showing the structure of an alloy film formed by a method different from the dual sputtering employing the Cu target and the Mn target.

The alloy film 31 can be formed also by sputtering employing a plurality of CuMn alloy targets having different Mn concentrations, for example, in place of the dual sputtering employing the Cu target and the Mn target. More specifically, a plurality of films made of alloys containing Cu and Mn and having different Mn concentrations can be successively formed on the overall surface of the second insulating layer 6 including the inner surfaces of the second groove 11 and the via hole 12 and the portion of the first wire 5 exposed through the via hole 12 by successively employing the CuMn alloy targets from that having the highest Mn concentration for the sputtering and colliding an ionized rare gas element with each CuMn alloy target.

In the alloy film 31 formed by this method, the Mn concentration changes stepwise to be reduced toward the surface side. When two types of CuMn alloy targets are employed, for example, the alloy film 31 has a high-concentration layer 51 having a relatively high Mn concentration provided on the side closer the inner surface of the second groove 11 and a low-concentration layer 52 having a relatively low Mn concentration provided on the high-concentration layer 51, as shown in FIG. 5.

When the high-concentration layer 51 has an Mn concentration of 10 at. % and a thickness of 30 nm and the low-concentration layer 52 has an Mn concentration of 1 at. % and a thickness of 60 nm, for example, the quantity of Mn contained in the overall alloy film 31 is identical to that in a case of forming a film made of an alloy material containing Cu and Mn and having a uniform Mn concentration of 4 at. % with a thickness of 90 nm (a thickness identical to that of the alloy film 31).

Thus, separation of the alloy film 31 from the side surfaces of the second groove 11 can be prevented without increasing the quantities of Mn remaining in the seed film 32 and the plating layer 33 (the second wire 14).

The alloy film 31 may have a structure obtained by stacking not less than three alloy films made of alloy materials containing Cu and Mn and having different Mn concentrations on the second insulating layer 6 in the order of the Mn concentrations.

FIGS. 6A to 6E are schematic sectional views showing the steps of manufacturing the semiconductor device by a method according to a third embodiment of the present invention. FIG. 7 is a graph showing the relation between an RF bias and coverage of the second groove and the via hole with the alloy film.

Figure 6A:
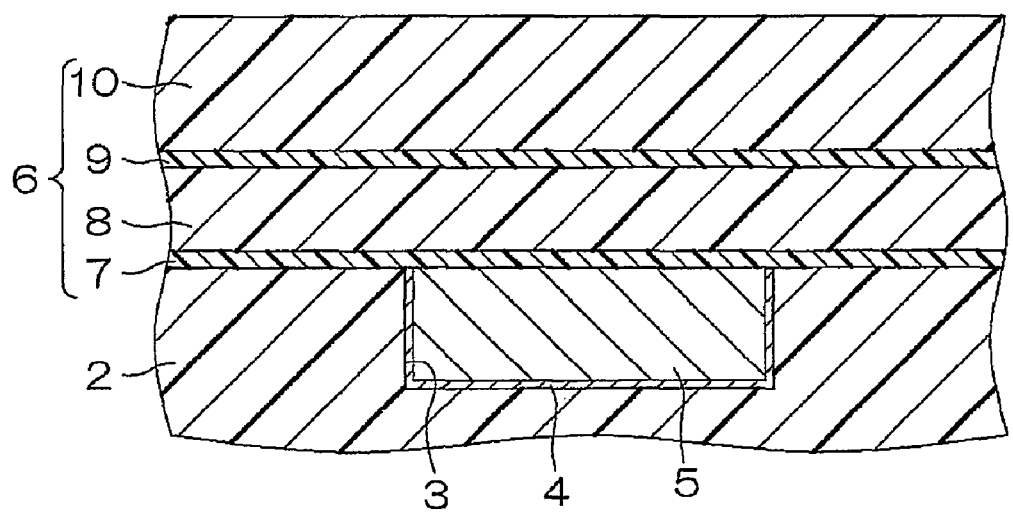
FIGS. 6A to 6E are schematic sectional views showing the steps of manufacturing a semiconductor device by a method according to a third embodiment of the present invention.
Figure 7:
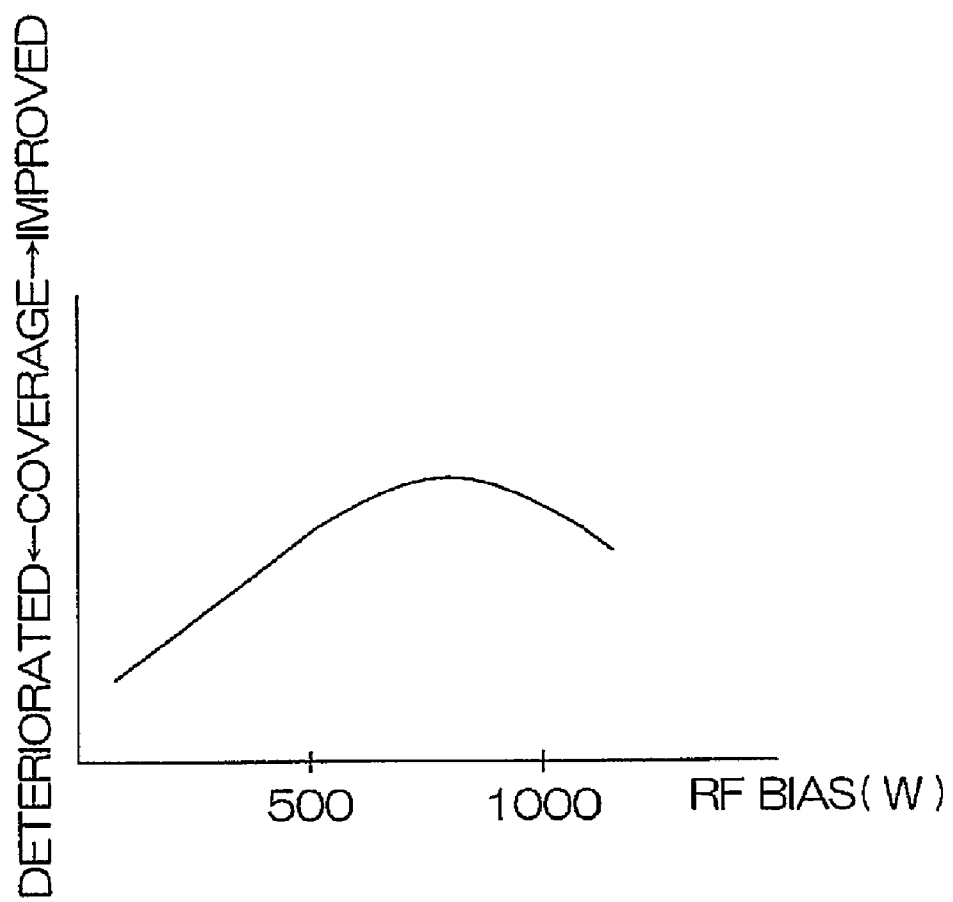
FIG. 7 is a graph showing the relation between an RF bias and coverage of a second groove and a via hole with an alloy film.

As shown in FIG. 6A, the diffusion preventing film 7, the first interlayer dielectric film 8, the etching stopper film 9 and the second interlayer dielectric film 10 are stacked in this order by CVD on the first insulating layer 2 having the first barrier film 4 and the first wire 5 embedded therein. Thus, the second insulating layer 6 is formed on the first insulating layer 2.

Figure 6B:
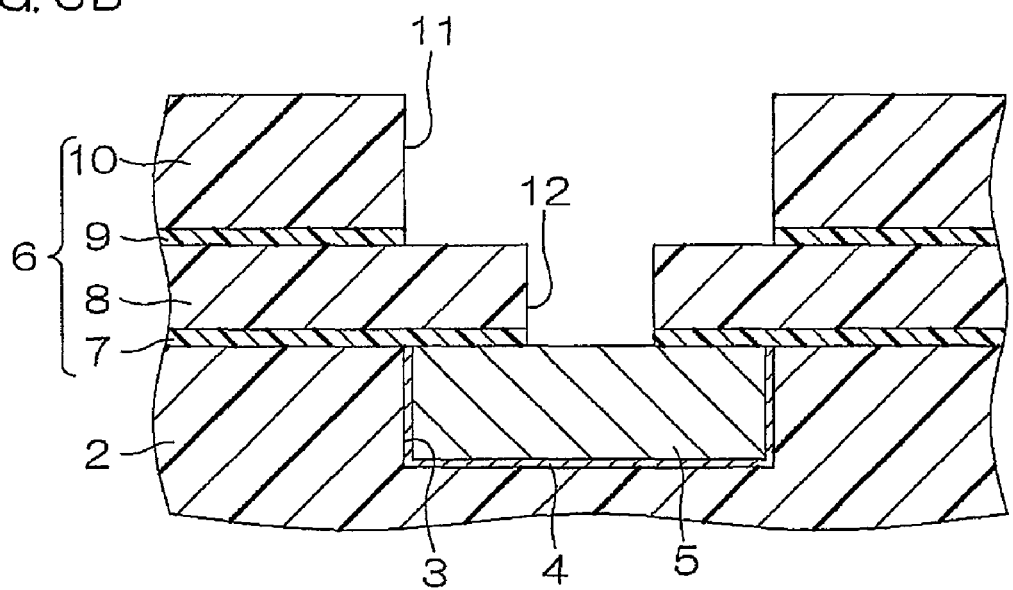

Thereafter the second groove 11 and the via hole 12 are formed in the second insulating layer 6, as shown in FIG. 6B. More specifically, a mask (not shown) having an opening selectively exposing a portion to be provided with the via hole 12 is first formed on the second insulating layer 6. Then, the second interlayer dielectric film 10, the etching stopper film 9 and the first interlayer dielectric film 8 are dry-etched through the mask. At this time, the second interlayer dielectric film 10, the etching stopper film 9 and the first interlayer dielectric film 8 are continuously etched by switching reaction gas (etchant) at proper timing. Then, the mask is removed from the second insulating layer 6, and another mask (not shown) having an opening selectively exposing a portion to be provided with the second groove 11 is formed on the second insulating layer 6. Then, the second interlayer dielectric film 10 is dry-etched through the mask. Thereafter the second groove 11 and the via hole 12 are formed by removing exposed portions of the diffusion preventing film 7 and the etching stopper film 9.

Figure 6C:
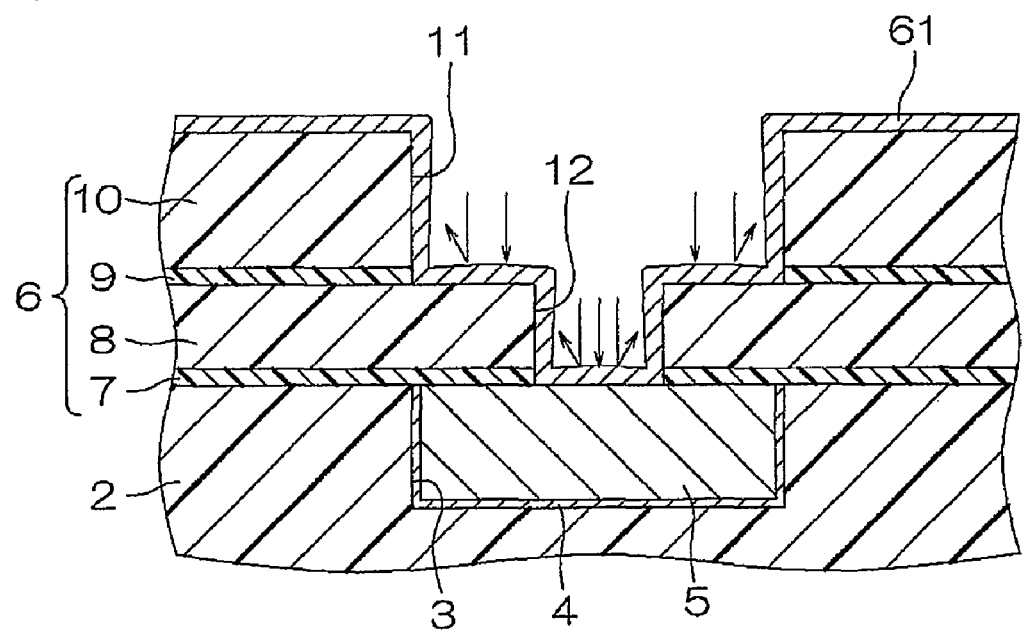

Then, the overall surface of the second insulating layer 6 including the inner surfaces of the second groove 11 and the via hole 12 and a portion of the first wire 5 exposed through the via hole 12 are covered with an alloy film 61 made of an alloy material (a CuMn alloy) containing Cu and Mn by bias sputtering, as shown in FIG. 6C.

At this time, an RF bias (RF power) is set in the range of 600 to 1000 W. Thus, sputtered particles scattering toward the inner surfaces of the second groove 11 and the via hole 12 are accelerated during the scattering, to collide with the bottom surface of the second groove 11 and the first wire 5 with high energy. The sputtered particles colliding with the bottom surface of the second groove 11 adhere to the bottom surface of the second groove 11, and partially flick those adhering to the bottom surface of the second groove 11. The sputtered particles colliding with the first wire 5 adhere to the first wire 5, and partially flick those adhering to the first wire 5. The sputtered particles flicked from the bottom surface of the second groove 11 and the first wire 5 re-adhere (re-sputter) to the side surfaces of the second groove 11 and the via hole 12 respectively. Therefore, the side surfaces of the second groove 11 and the via hole 12 are covered with the alloy film 61 having a generally uniform thickness.

As shown in FIG. 7, coverage of the side surfaces of the second groove 11 and the via hole 12 with the alloy film 61 is most improved when the RF bias is about 800 W and reduced (deteriorated) as the RF bias separates from 800 W.

If the RF bias is extremely lower than 800 W, the sputtered particles scattering toward the inner surfaces of the second groove 11 and the via hole 12 collide with the bottom surface of the second groove 11 and the first wire 5 without being sufficiently accelerated during the scattering. Therefore, the quantity of the sputtered particles flicked from the bottom surface of the second groove 11 and the first wire 5 to re-adhere to the side surfaces of the second groove 11 and the via hole 12 is reduced. Consequently, the thickness of the portions of the alloy film 61 formed on the side surfaces of the second groove 11 and the via hole 12 is reduced below that of the portions formed on the second groove 11 and the first wire 5, and the coverage of the side surfaces of the second groove 11 and the via hole 12 with the alloy film 61 is reduced.

If the RF bias is extremely higher than 800 W, on the other hand, the sputtered particles scattering toward the inner surfaces of the second groove 11 and the via hole 12 are excessively accelerated during the scattering, to collide with the bottom surface of the second groove 11 and the first wire 5. Therefore, the quantity of sputtered particles flicked from the bottom surface of the second groove 11 and the first wire 5 to re-adhere the side surfaces of the second groove 11 and the via hole 12 is increased. Consequently, the portions of the alloy film 61 formed on the side surfaces of the second groove 11 and the via hole 12 extend (overhang) to block the second groove 11 and the via hole 12, and hence the thickness of the alloy film 61 is irregularized in these portions, and the coverage of the second groove 11 and the via hole 12 with the alloy film 61 is reduced.

Therefore, the RF bias is set in the proper range of 600 to 1000 W not causing such reduction of the coverage.

Figure 6D:
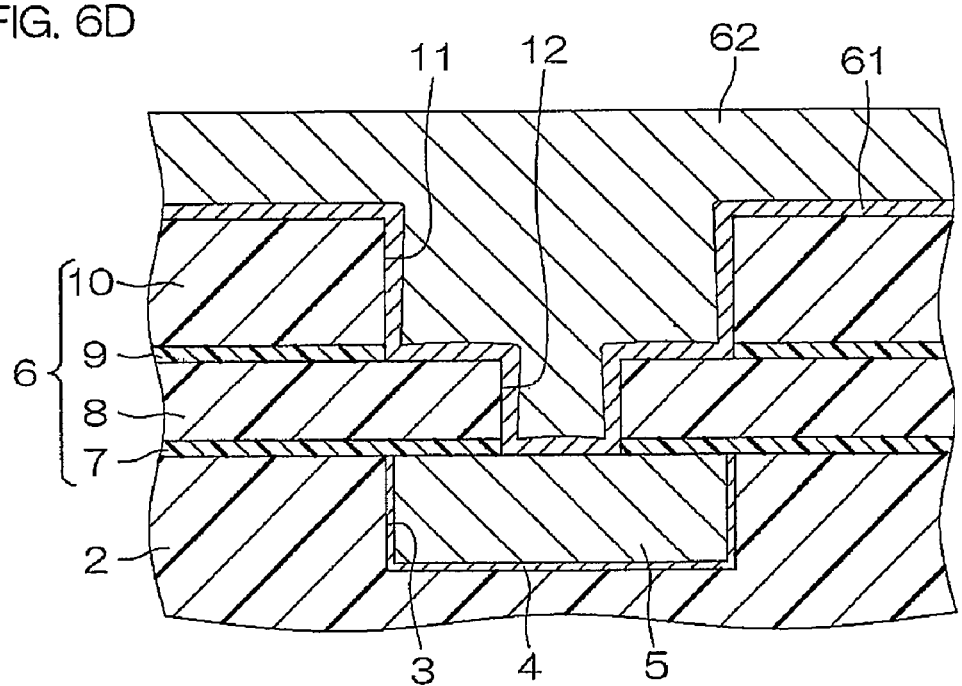

Thereafter a plating layer 62 made of Cu is formed on the alloy film 61 by plating, as shown in FIG. 6D. The plating layer 62 is formed with a thickness for filling up the via hole 12 and the second groove 11.

Figure 6E:
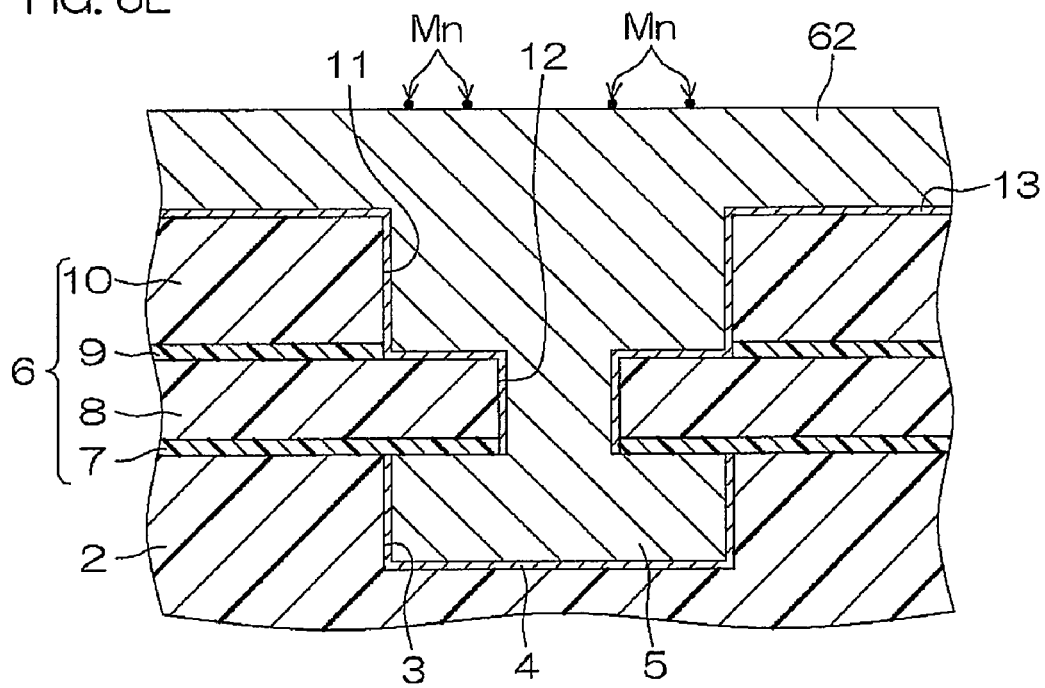

Thereafter Mn in the alloy film 61 is bonded to Si and O in the second insulating layer 6 by heat treatment. Consequently, the second barrier film 13 made of MnSiO is formed on the inner surfaces of the second groove 11 and the via hole 12, as shown in FIG. 6E. At this time, Mn in the alloy film 61 partially moves in the plating layer 62, and is deposited on the surface of the plating layer 62. The alloy film 61 disappears following the formation of the second barrier film 13. Then, the plating layer 62 and the second barrier film 13 are polished by CMP. The polishing is continued until unnecessary portions of the plating layer 62 and the second barrier film 13 formed outside the second groove 11 are entirely removed, the second insulating layer 6 (the second interlayer dielectric film 10) is exposed, and the exposed surface of the second insulating layer 6 and the surface of the plating layer 62 in the second groove 11 are flush with each other. Thus, the second wire 14 is formed, and the semiconductor device 1 shown in FIG. 1 is obtained.

Thus, the alloy film 61 is formed by bias sputtering. In the formation of the alloy film 61 by bias sputtering (the step shown in FIG. 6C), the RF bias for accelerating the sputtered particles is set to 600 to 1000 W, so that the sputtered particles adhering to the bottom surfaces of the second groove 11 and the via hole 12 are flicked by the energy of the sputtered particles scattering toward the inner surfaces of the second groove 11 and the via hole 12 and the flicked sputtered particles re-adhere (re-sputter) to the side surfaces of the second groove 11 and the via hole 12. Therefore, adhesiveness of the alloy film 61 to the side surface of the second groove 11 (side coverage) can be improved as compared with a case of forming the alloy film 61 by non-bias sputtering (sputtering applying no RF bias).

Consequently, the thickness of the portions of the alloy film 61 formed on the side surfaces of the second groove 11 and the via hole 12 can be approximated to the thickness of the portions formed on the bottom surface of the second groove 11 and the first wire 5, and the alloy film 61 having a generally uniform thickness can be formed on the overall regions of the inner surfaces of the second groove 11 and the via hole 12. When the alloy film 61 is set to the minimum thickness necessary for forming the second barrier film 13, therefore, the quantity of excess Mn not contributing to the formation of the second barrier film 13 can be reduced while preventing separation of the alloy film 61 from the side surfaces of the second groove 11 and the via hole 12.

While a method of forming the first barrier film 4 and the first wire 5 has not been described, the first barrier film 4 and the first wire 5 can be formed by a method similar to that for forming the second barrier film 13 and the second wire 14. In other words, the first groove 3 in the form of the recess dug from the surface of the first insulating layer 2 is formed by photolithography and etching, and an alloy film made of a CuMn alloy is thereafter formed on the inner surface of the first groove 3 by bias sputtering. At this time, the RF bias is set to 600 to 1000 W. Thereafter a plating layer made of Cu is formed on the alloy film by plating. After heat treatment, unnecessary portions (portions formed outside the first groove 3) of the plating layer are removed by CMP. Thus, the first barrier film 4 and the first wire 5 are obtained in the first groove 3.

In the step (the step shown in FIG. 6C) of forming the alloy film 61, the RF bias may be changed following the progress of the step. More specifically, the RF bias may be changed from a first bias (0 to 400 W, for example) not positively causing re-sputtering to a higher bias, i.e., a second bias (600 to 1000 W, for example) positively causing sputtering in the process of the step of forming the alloy film 61.

The first barrier film 4 and the first wire 5 can be formed by another method similar to that for forming the second barrier film 13 and the second wire 14. In other words, the first groove 3 in the form of the recess dug from the surface of the first insulating layer 2 is formed by photolithography and etching, and the side surfaces and the bottom surface of the first groove 3 are thereafter covered with an alloy film made of an alloy material containing Cu and Mn by sputtering. Then, the thickness of a portion of the alloy film covering the bottom surface of the first groove 3 is reduced by reverse sputtering, and a seed film made of a metallic material mainly composed of Cu is thereafter formed on the alloy film by sputtering. Thereafter a plating layer made of Cu is formed on the seed film by plating. After heat treatment, unnecessary portions (portions formed outside the first groove 3) of the plating layer are removed by CMP. Thus, the first barrier film 4 and the first wire 5 are obtained in the first groove 3.

The first barrier film 4 and the first wire 5 can be formed by further other method similar to that for forming the second barrier film 13 and the second wire 14. In other words, the first groove 3 in the form of the recess dug from the surface of the first insulating layer 2 is formed by photolithography and etching, and the side surfaces and the bottom surface of the first groove 3 are thereafter covered with an alloy film made of an alloy material containing Cu and Mn by sputtering. The alloy film is so formed that the portion in contact with the inner surface of the first groove 3 has a relatively high Mn concentration, Mn concentration is reduced toward the surface layer portion and the surface layer portion has a relatively low Mn concentration. Thereafter a plating layer made of Cu is formed on the seed film by plating. After heat treatment, unnecessary portions (portions formed outside the first groove 3) of the plating layer are removed by CMP. Thus, the first barrier film 4 and the first wire 5 are obtained in the first groove 3.

The diffusion preventing film 7 has the structure obtained by stacking SiC and SiCN. Alternatively, the diffusion preventing film 7 may have a structure consisting of only SiC, for example, so far as the same has barrier properties against diffusion of Cu.

The first interlayer dielectric film 8 and the second interlayer dielectric film 10 are made of $SiO_2$. However, the material for the first interlayer dielectric film 8 and the second interlayer dielectric film 10 may simply be an insulating material containing Si and O, and SiOC (carbon-doped silicon oxide) or SiOF (fluorine-doped silicon oxide), for example, can be employed as the material for the first interlayer dielectric film 8 and the second interlayer dielectric film 10, in place of $SiO_2$.

While the present invention has been described in detail byway of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-202139 filed with the Japan Patent Office on Aug. 5, 2008, Japanese Patent Application No. 2008-214627 filed with the Japan Patent Office on Aug. 22, 2008, and Japanese Patent Application No. 2008-221833 filed with the Japan Patent Office on Aug. 29, 2008, the disclosures of these applications are incorporated herein by reference.

What is claimed is:

1. A method of manufacturing a semiconductor device, comprising:
   a groove forming step of forming a groove in an insulating layer made of an insulating material containing Si and O;
   an alloy film applying step of covering the side surface and the bottom surface of the groove with an alloy film made of an alloy material containing Cu and Mn by sputtering;
   a thinning step of reducing the thickness of a portion of the alloy film covering the bottom surface of the groove using a reduction rate higher than a reduction rate of the thickness of a portion of the alloy film covering the side surface of the groove;
   a wire forming step of forming a Cu wire made of a metallic material mainly composed of Cu in the groove after the thinning step; and
   a barrier film forming step of forming a barrier film made of $Mn_xSi_yO_z$ (x, y and z: numbers greater than zero) between the Cu wire and the insulating layer by heat treatment.

2. The method of manufacturing a semiconductor device according to claim 1, wherein reverse sputtering is employed in the thinning step, and the wire forming step includes the steps of:
   forming a seed film made of a metallic material mainly composed of Cu on the alloy film by sputtering after the thinning step; and
   forming a plating layer made of Cu on the seed film by plating.

3. The method of manufacturing a semiconductor device according to claim 2, wherein gas particles are collided with the alloy film from a direction along the stacking direction of the insulating layer in the thinning step.

4. The method of manufacturing a semiconductor device according to claim 1, wherein the alloy film is formed to have a thickness not causing separation of the alloy film on the side surface of the groove.

5. A method of manufacturing a semiconductor device, comprising:
   a groove forming step of forming a groove in an insulating layer made of an insulating material containing Si and O;
   an alloy film applying step of covering the inner surface of the groove with an alloy film made of an alloy material containing Cu and Mn by sputtering so that a portion in contact with the inner surface of the groove has a relatively high Mn concentration and a surface layer portion has a relatively low Mn concentration;
   a Cu layer forming step of forming a Cu layer made of a metallic material mainly composed of Cu on the alloy film to fill up the groove; and
   a barrier film forming step of forming a barrier film made of $Mn_xSi_yO_z$ (x, y and z: numbers greater than zero) between the Cu layer and the insulating layer by heat treatment.

6. The method of manufacturing a semiconductor device according to claim 5, wherein
   an ionized rare gas element is collided with a Cu target and an Mn target at the same time, the collisional energy of the rare gas element with respect to the Cu target is increased and that of the rare gas element with respect to the Mn target is reduced as the film formation progresses in the alloy film applying step.

7. The method of manufacturing a semiconductor device according to claim 5, wherein
   a plurality of CuMn alloy targets having different Mn concentrations are successively employed from that having the highest Mn concentration, and an ionized rare gas element is collided with each CuMn alloy target in the alloy film applying step.

8. A method of manufacturing a semiconductor device, comprising:
   a groove forming step of forming a groove in an insulating layer made of an insulating material containing Si and O;
   an alloy film applying step of covering the inner surface of the groove with an alloy film made of an alloy material containing Cu and Mn by bias sputtering;
   a Cu layer forming step of forming a Cu layer made of a metallic material mainly composed of Cu on the alloy film to fill up the groove; and
   a barrier film forming step of forming a barrier film made of $Mn_xSi_yO_z$ (x, y and z: numbers greater than zero) between the Cu layer and the insulating layer by heat treatment, wherein an RF (Radio Frequency) bias is so set in the alloy film applying step that sputtered particles adhering to the bottom surface of the groove are flicked to adhere to the side surface of the groove by the energy of sputtered particles scattering toward the inner surface of the groove.

9. The method of manufacturing a semiconductor device according to claim 8, wherein the RF bias is set in the range of 600 to 1000 W.

10. The method of manufacturing a semiconductor device according to claim 9, wherein coverage of the side surface of the groove with the alloy film is most improved when the RF bias is 800 W and deteriorated as the RF bias separates from 800 W.

11. The method of manufacturing a semiconductor device according to claim 1, wherein the alloy film applying step and the thinning step are performed in a sputtering apparatus.

12. The method of manufacturing a semiconductor device according to claim 5, wherein the alloy film applying step includes forming the portion in contact with the inner surface of the groove having a relatively high Mn concentration at a thickness of about 30 nm.

13. The method of manufacturing a semiconductor device according to claim 5, wherein the alloy film applying step includes forming the surface layer portion having a relatively low Mn concentration at a thickness of about 60 nm.

* * * * *